(12) United States Patent
Wyville (10) Patent No.: US 8,604,959 B2
(45) Date of Patent: Dec. 10, 2013

(54) MULTI-PHASED DIGITAL-TO-ANALOG CONVERTERS FOR INTERPOLATION

(75) Inventor: Mark William Wyville, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 50 days.

(21) Appl. No.: 13/396,295

(22) Filed: Feb. 14, 2012

(65) Prior Publication Data

US 2013/0207823 A1   Aug. 15, 2013

(51) Int. Cl.
*H03M 1/66* (2006.01)
(52) U.S. Cl.
USPC .......................................... 341/144; 341/145
(58) Field of Classification Search
USPC ........... 341/144, 145, 148; 375/296, 295, 297
See application file for complete search history.

(56) References Cited

U.S. PATENT DOCUMENTS

| | | | |
|---|---|---|---|
| 6,373,902 B1 * | 4/2002 | Park et al. ...................... | 375/296 |
| 6,518,902 B2 * | 2/2003 | Panasik et al. ................ | 341/141 |
| 7,107,022 B1 | 9/2006 | Thomas et al. | |
| 7,656,986 B2 * | 2/2010 | Chen ............................. | 375/375 |
| 8,237,595 B2 * | 8/2012 | Petrovic ........................ | 341/144 |

\* cited by examiner

*Primary Examiner* — Brian Young
(74) *Attorney, Agent, or Firm* — Christopher & Weisberg, P.A.

(57) ABSTRACT

A method and device for digital filtering of a digital signal in a radio frequency (RF) device front end are disclosed. In one embodiment, 2M+1 groups of N digital-to-analog converters (DAC) are grouped to emulate a (2M+1)*N tap finite impulse response (FIR) filter. Each DAC in a group receives a clock that differs in phase from the clocks of the other DACs in the group. The filter is implemented to suppress image spectra of the digital signal without increasing a clock rate by which the signal is sampled.

19 Claims, 8 Drawing Sheets

MULTI-PHASED DIGITAL-TO-ANALOG CONVERTERS FOR INTERPOLATION

TECHNICAL FIELD

The present invention relates to wireless communications, and in particular to a method of digital-to-analog conversion and interpolation in a radio frequency (RF) front end.

BACKGROUND

Digital processors are used in modern communication devices to perform complex signal processing while adhering to reasonable power and size constraints. In order to communicate information to another radio, digital signals are converted to analog signals. This conversion process is performed by a digital-to-analog converter (DAC).

Figure 1:
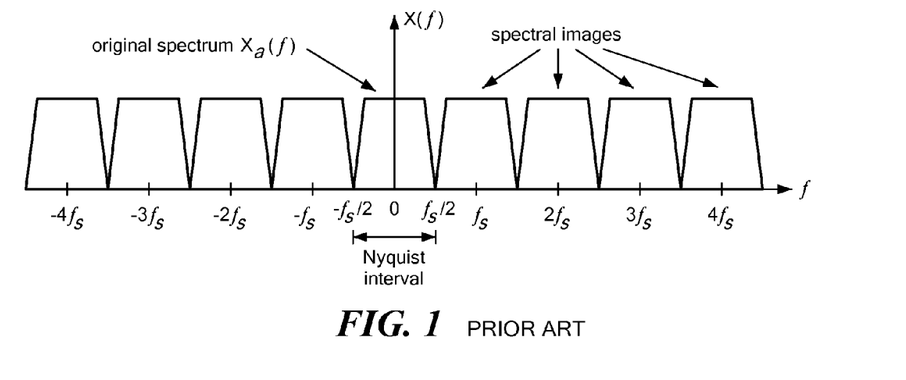
FIG. 1 is an illustration of a frequency spectra of a digital signal.

The frequency representation of a digital signal consists of an infinite number of replicas of the desired analog signal, as shown in FIG. 1. The replicas are separated in the frequency domain by $f_s$, where $f_s$ is the frequency of the digital clock that times the digital signal. These replicas are undesirable after conversion to the analog domain. Several approaches are used to remove these replicas in the analog domain, including analog low pass filtering, interpolation, high order sample-and-hold circuits, and combining the output of multiple DACs that have offset clocks.

An analog low pass filter with a stop band that starts at $f_s/2$ removes all replicas except the one centered at zero frequency (DC). The pass band of the analog low pass filter must be as large as the desired signal bandwidth. If the desired signal bandwidth is close to $f_s/2$, as in FIG. 1, then there is only a small region for the filter to transition from pass band to stop band. A short transition region requires a highly selective filter, which means that the filter must be physically large and complex to design.

Figure 2:
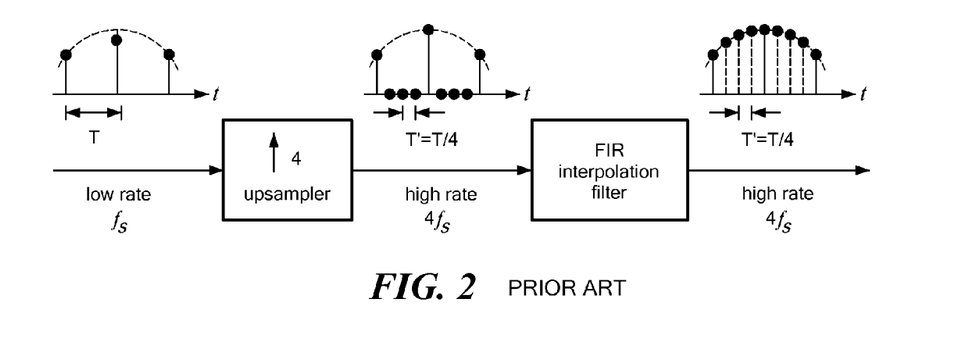
FIG. 2 is an illustration of up-sampling and interpolation of a digital signal.
Figure 3:
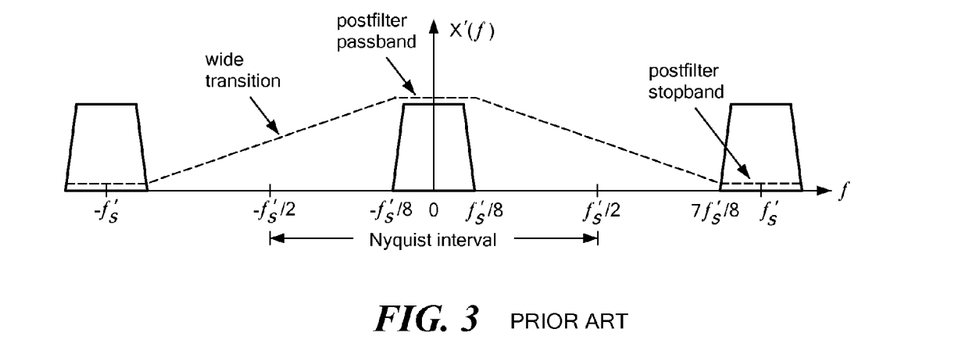
FIG. 3 is an illustration of a frequency spectra of a digital signal that has been up-sampled by a factor of four.

Interpolation in the digital domain consists of up-sampling the signal, then digitally filtering the additional images generated by the up-sampling process. As shown in FIG. 2 for an up-sampling ratio of four, the up-sampling clock operates at a faster rate than the digital clock that clocks the digital data input to the interpolator. Thus, the sampling at the output of the interpolator is higher, so that the replicas of the signal are spaced further apart in the frequency domain. This is so, because the spacing between the replicas is $f_s$. Since the replicas are spaced further apart, the selectivity of the low pass filter at the DAC output can be relaxed. This is shown in FIG. 3. Thus, interpolation is equivalent to sampling a signal faster than the Nyquist rate, where the Nyquist rate is twice a signal's baseband bandwidth.

Figure 4:
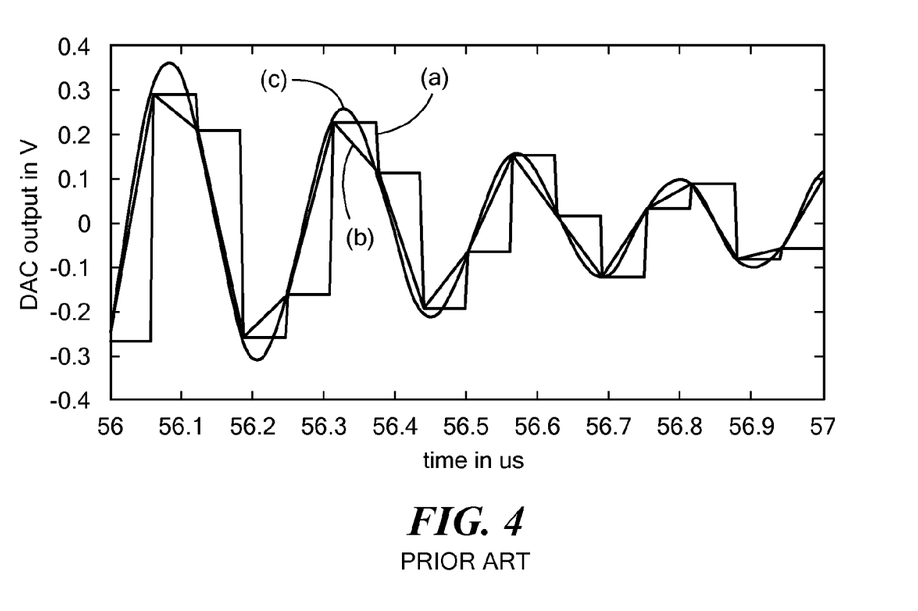
FIG. 4 is a plot of curves representing (a) a zero order hold, (b) a first order hold, and (c) a second order hold.
Figure 5:
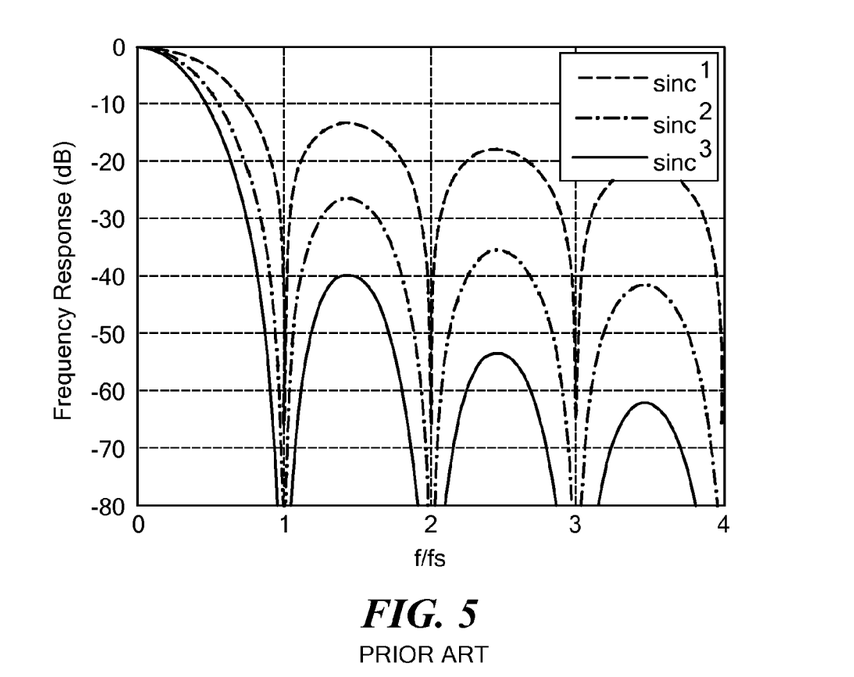
FIG. 5 is plot of sinc function spectra of a zero order hold function, a first order hold function, and a second order hold function.

The manner in which the DAC generates the analog signal shapes the effective frequency response of the DAC. A DAC may apply a zero-order hold, a first-order hold, a second-order hold, etc. With zero-order hold, the signal is held constant for one clock period (curve a of FIG. 4). With a first-order hold a straight line is generated between two consecutive samples (curve b of FIG. 4). With a second-order hold, a quadratic curve connects three consecutive samples (curve c of FIG. 4). The frequency responses of the zero-order hold, the first-order hold, and the second-order hold are $$sinc\left(\frac{\pi f}{f_s}\right), sinc^2\left(\frac{\pi f}{f_s}\right), \text{ and } sinc^3\left(\frac{\pi f}{f_s}\right),$$

respectively. These functions are graphed in FIG. 5, which shows that the functions have nulls at the center of all undesired replicas.

Each hold order requires a differentiator in the digital domain and an integrator in the analog domain. For example, a single-order hold requires two digital differentiators and two analog integrators. The frequency response of the high order holds is not flat over the desired signal's pass band, so some form of compensation is required. Further, high order holds, of themselves, do not significantly relax the low pass filter requirements since their frequency responses do not provide sufficient stop band attenuation near $f_s/2$. However, high order holds can be used with interpolation to relax low pass filter requirements. This is so because interpolation confines more of the replicas' signal energy to the vicinity of the nulls of the high order hold frequency responses.

Multiphase clocking involves summing the output of parallel DACs, with each DAC clock offset from the others. Multiple DACs with different clock phases can be used to provide additional nulls in the frequency response. The same input signal is fed to each of the DACs. The additional nulls can be used to attenuate images beyond that achievable by a zero-order hold frequency response.

Ideally, transmitters should integrate the DAC and frequency up-conversion functions into a single integrated chip. The low pass filters required in all of the above-described approaches do not integrate well onto chips due to their large area and a lack of precise passive devices. In order to integrate the DAC and frequency up-conversion functions, all undesired replicas at the DAC output need to be significantly attenuated with a small integrated low pass filter—which implies low selectivity—or no filter at all.

If the undesired replicas are not significantly attenuated, non-linear action in the up-conversion process will result in inter-modulation distortion (IMD) falling within the pass band. The replicas and their IMD components outside the pass band must be filtered after up-conversion by a highly selective RF band pass filter, which is typically larger and more complex than the low pass filter it replaces.

In summary, high order sample-and-hold using analog integrators requires passive and possibly active components between the DAC and up-conversion mixer. As with a highly selective low pass filter, additional passive components do not integrate well into a single chip solution. Interpolation requires the clock rate to be increased by the up-sampling ratio. A large up-sampling ratio is required to increase the attenuation bandwidth of the images. However, a very fast clock is unrealistic, especially with the large signal bandwidths typical of base station transmitters in a wireless communication system. Parallel DACs fed with the same digital signal have been used to attenuate certain images. This approach may provide notches in the frequency response which can be collocated with replicas. However, these notches have a fixed attenuation bandwidth which may not be sufficiently wide for the large signal bandwidths that are typical of signals at a base station.

Therefore, what is needed is a combination of digital-to-analog conversion and frequency up-conversion that suppresses undesired replicas in the spectra of a signal, that does not require a higher speed clock, that does not require high order filtering, and that can be integrated onto a single integrated circuit chip.

SUMMARY

The present invention advantageously provides a method and system for converting a digital input signal to an analog signal. According to one aspect, 2M+1 groups of N digital-to-analog converters (DAC) per group are provided. Each group receives the digital input signal. M is an integer greater than or equal to zero, and N is an integer greater than 1. Each of the N DACs in a group are electrically in parallel. Each DAC in a group is clocked by a clock that differs in phase by 1/N of a clock that clocks a preceding DAC of the N DACs in the group. Further, 2M+1 groups of N multipliers, one multiplier for each of the N DACs in a group, are provided. Each multiplier multiplies a DAC input to a corresponding DAC by a filter coefficient. The filter coefficients are chosen to achieve a desired filter response. A combiner combines the DAC outputs to produce the analog signal.

According to another aspect, the invention provides a method of up-converting a digital input signal and converting the digital input signal to an analog signal. The method includes applying N clocks, one clock to each of N DACs in a group, each clock differing in phase by 1/N of a clock period of the N clocks. N is an integer greater than one, and the N DACs of a group are electrically in parallel. A DAC input for each of the N DACs in at least one of 2M+1 groups of N DACs is multiplied by a corresponding filter coefficient. M is an integer greater than or equal to zero. The outputs of the (2M+1)N DACs are combined by a combiner to produce the analog signal.

According to another aspect, the invention provides a device for filtering and up-converting a digital input signal. The device includes a clock generator, a filter coefficient generator, and a plurality of groups of DACs. The clock generator produces a plurality of clocks. One of the plurality of clocks is a reference clock. Each of the plurality of clocks other than the reference clock differ in phase from the reference clock by a different corresponding fraction of a clock cycle. The filter coefficient generator generates a plurality of filter coefficients. Each group of DACs receives an input that is delayed by at least one clock cycle from the input of a preceding group of DACs. The input to each DAC is multiplied by a corresponding one of the plurality of filter coefficients. Each DAC is clocked by a corresponding one of the plurality of clocks.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Before describing in detail exemplary embodiments that are in accordance with the present invention, it is noted that the embodiments reside primarily in combinations of apparatus components and processing steps related to digital-to-analog conversion and up-conversion in radio frequency (RF) front end in a wireless communication system. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In some embodiments, a multiphase clock is applied to a group of DACs, all the DACs of a group having the same digital input. Each group receives the digital input, delayed by one clock period from the digital input of a preceding group. Each DAC within a group has a real multiplier that is clocked at the digital clock frequency. The multipliers can be chosen to function in the same manner as an interpolator, but without increasing the clock frequency.

Figure 6:
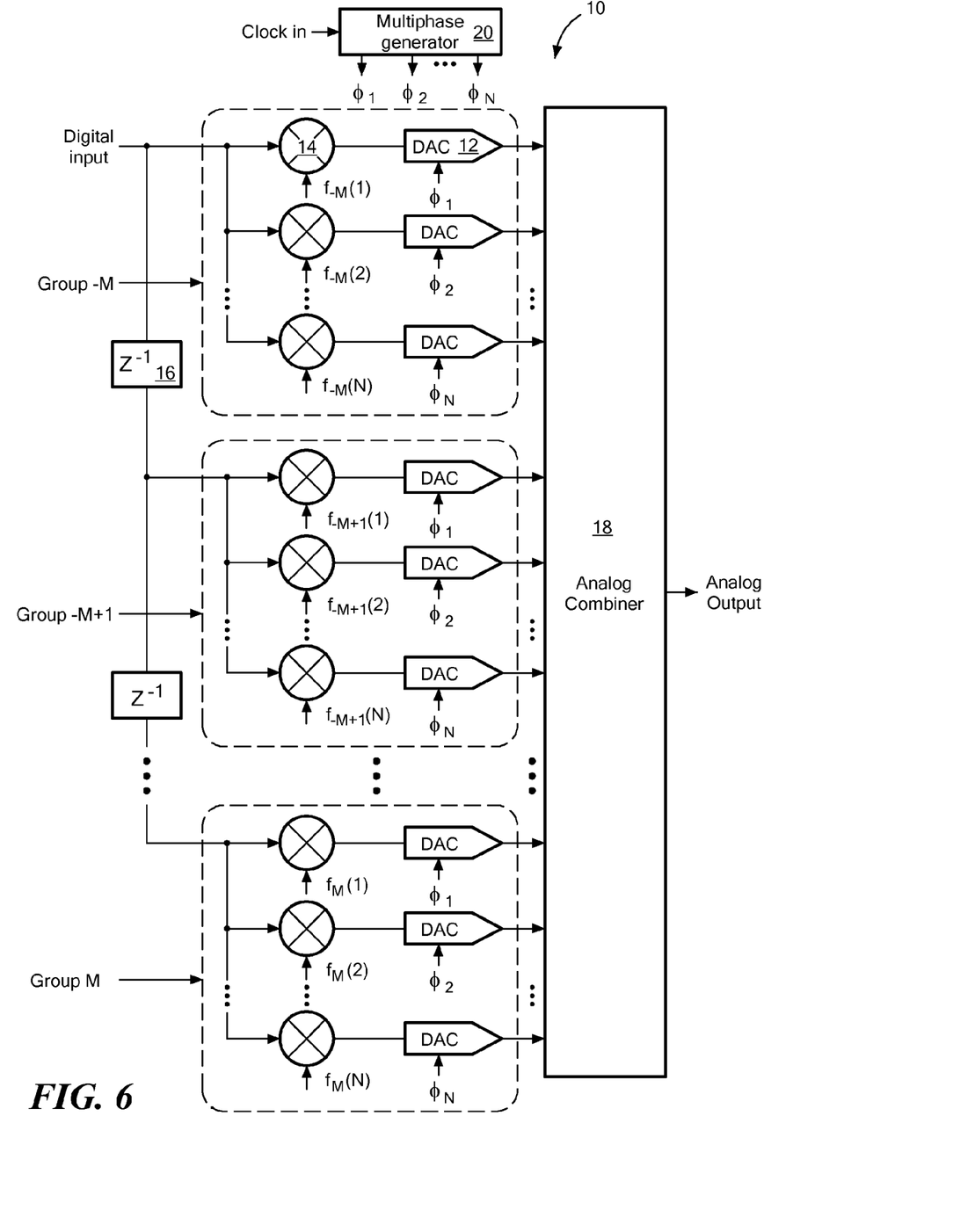
FIG. 6 is an exemplary embodiment of a digital filter having a clock period of T and constructed in accordance with principles of the present invention.

Referring now to the drawing figures, in which like reference designators denote like elements, there is shown in FIG. 6 a diagram of an exemplary embodiment of a digital filter constructed in accordance with principles of the present invention and generally denoted as system "10." System 10 may include 2M+1 groups of N digital-to-analog converters (DAC) 12 and N multipliers 14. Each group receives a digital input that is delayed by a delay device 16 so that a group receives the digital input signal delayed by one clock cycle from the digital signal received by the immediately preceding group. Thus, in the embodiment of FIG. 6 there are 2M delay elements 16, (2M+1)*N DACs 12 and (2M+1)*N multipliers 14.

Note that the phases of the clocks that clock the DACs 12 within a group are offset by an amount T/N where T is the clock period and N is the number of DACs 12 in a group. The clock phases are produced by a multi-phase clock generator 20.

The outputs of each DAC 12 are input to an analog combiner 18 which sums the outputs to produce an analog output signal. Note that high speed DACs generally have current outputs, which means that the output analog combiner 18 can be realized by directly connecting the outputs of all of the DACs 12.

In the analog output signal, replicas of the image spectra of the digital input signal are substantially suppressed to produce an output signal whose energy is substantially confined to a Nyquist interval. The frequency spectrum of the analog output signal is given by:

$$Y_{out}(\omega) = \frac{T}{N} D(\omega) \frac{\sin(\omega T/2N)}{\omega T/2N} \sum_{m=-M}^{M} \left( \sum_{k=1}^{N} f_m(k) e^{j\omega kT/N} \right) e^{j\omega mT} \quad (1)$$

where the following terms within this equation are defined as follows:
- ω is the frequency variable with units of rad/s
- T is the period of the digital clock
- N is the number of different clock phases used
- D(ω) is the frequency spectrum of the digital input signal
- $f_m(k)$ are the multiplier coefficients
- 2M+1 is the number of groups of DACs The desired values of the coefficients $f_m(k)$ that are input to the multipliers 14 are selected based on the desired frequency response of the equivalent interpolation filter of system 10. Typically, a low pass filter response is desired. However, other responses may be realized which also provide image attenuation with, perhaps, fewer coefficients.

Figure 7:
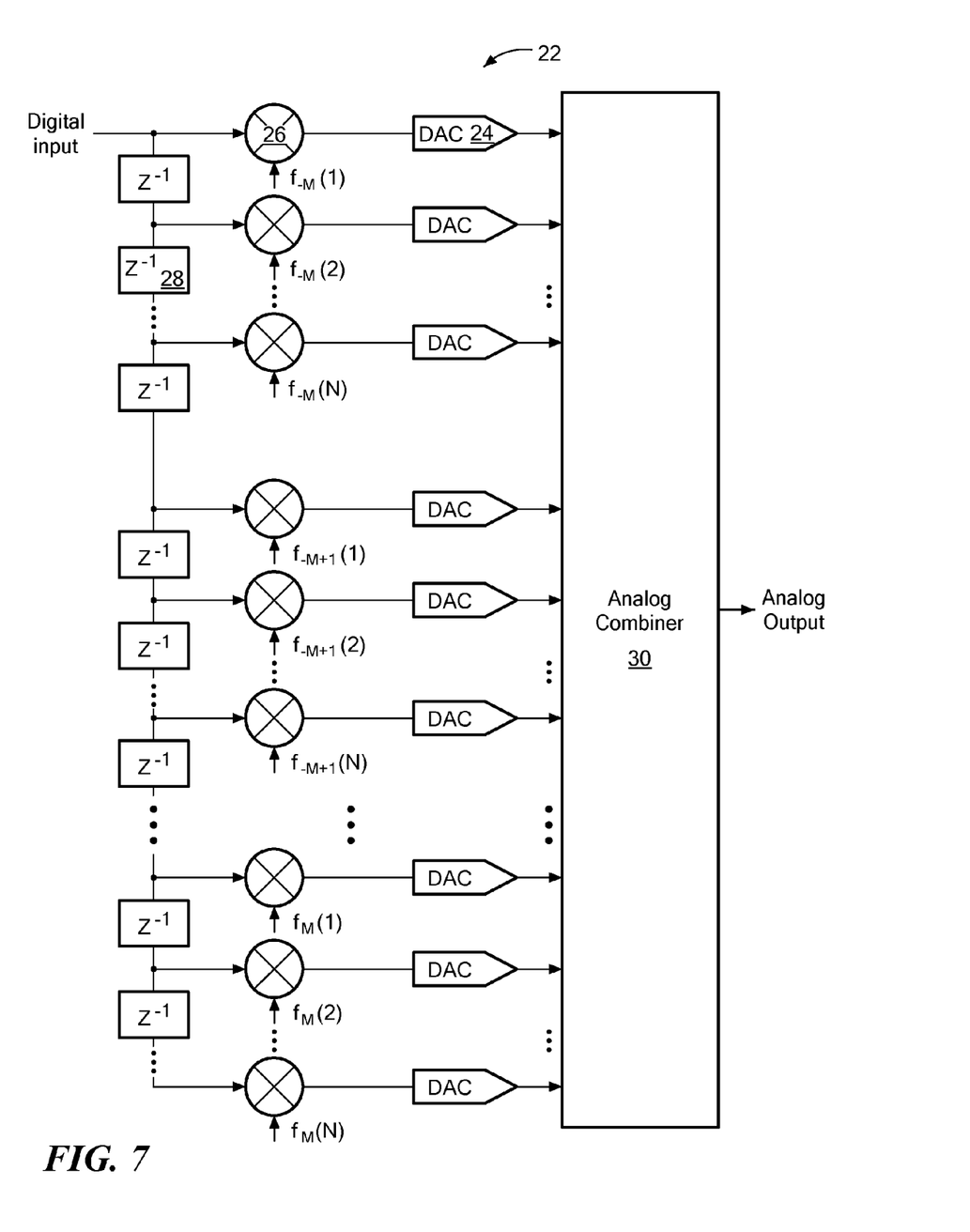
FIG. 7 is an filter that produces an output equivalent to the output of the digital filter of FIG. 6, but with a clock period of T/N.

The dual summation in equation (1) is equivalent to the response of a finite impulse response (FIR) filter with (2M+1)*N taps and a digital clock period of T/N. This mathematically equivalent FIR filter is shown in FIG. 7, and generally denoted as system 22. System 22 has (2M+1)*N DACs 24, (2M+1)*N multipliers 26, and (2M+1)*N−1 delay elements 28. In contrast to system 10, system 22 has no multi-phase clock system and the sample rate of the clock of system 22 is N times the sample rate of the clock of system 10.

In the system 22 of FIG. 7, digital data with a clock period of T is up-sampled to the clock period of T/N, then low pass filtered by the FIR response of the multipliers to attenuate the high frequency images. The same functionality is realized by the system 10 of FIG. 6, but without the increased sampling of the digital input signal.

Figure 8:
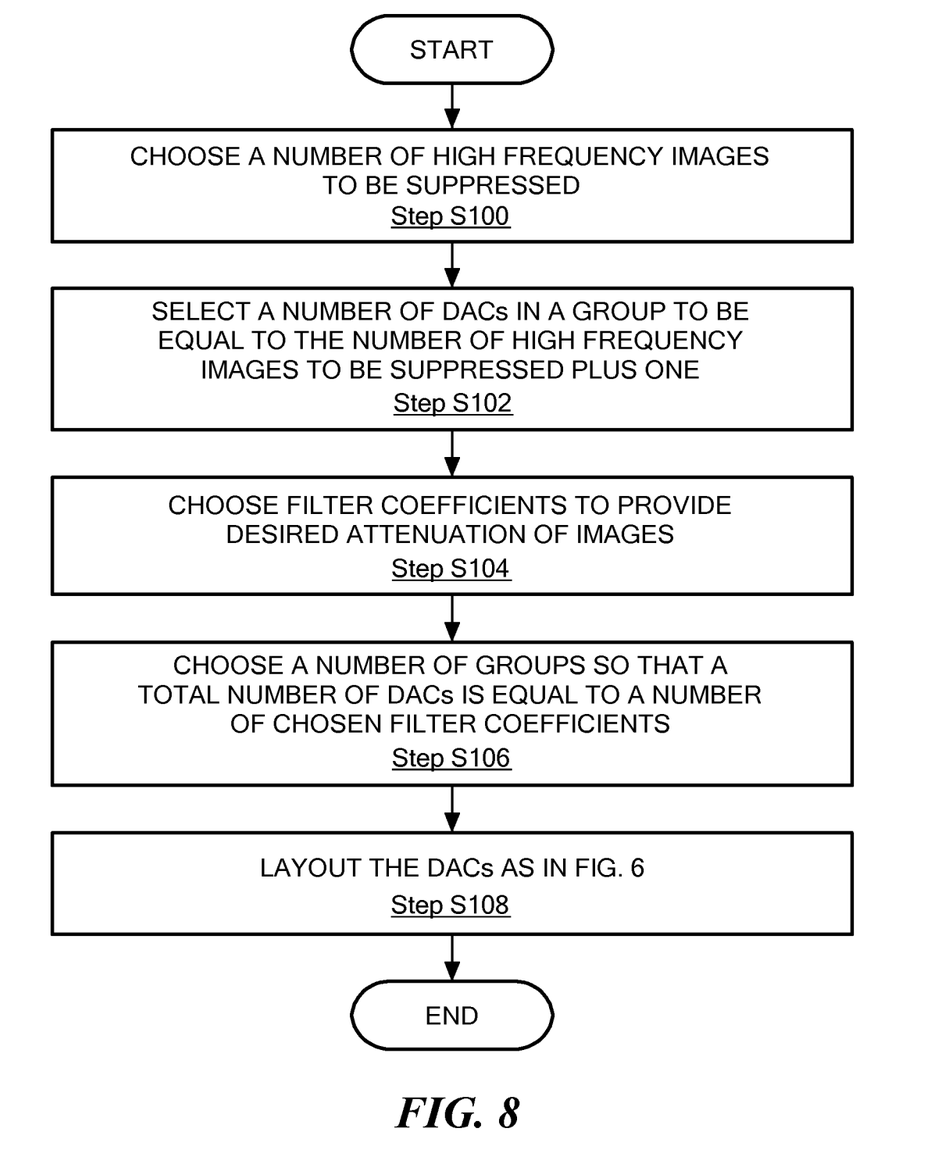
FIG. 8 is a flowchart of an exemplary process for designing a digital filter according to principles of the present invention.
Figure 9:
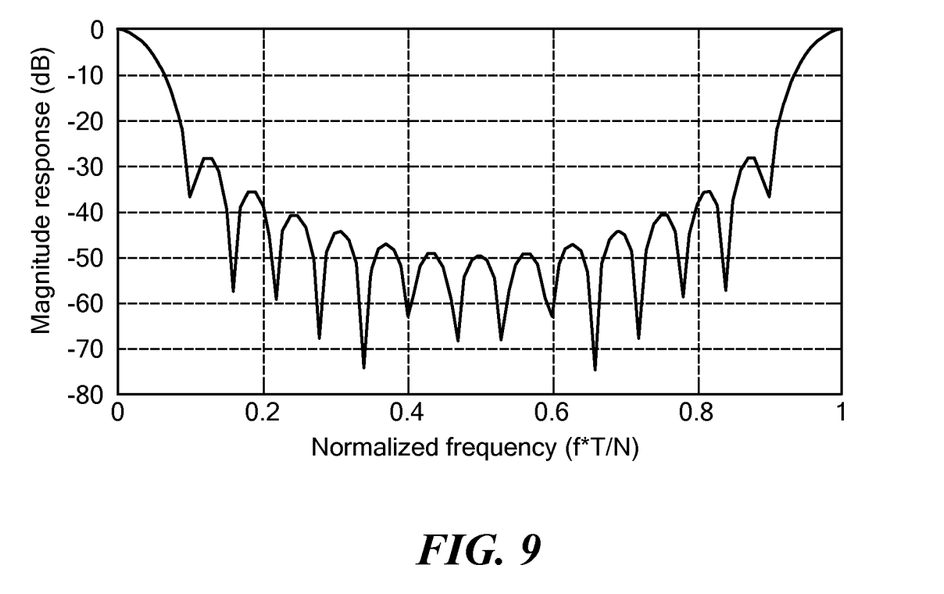
FIG. 9 is a response of a filter constructed according to the process of FIG. 8.

FIG. 8 is a flowchart of an exemplary process for designing a digital filter such as the digital filter of FIG. 6. In this embodiment, the coefficients $f_m(k)$ are selected to provide a low pass frequency response. A number of high frequency images to be suppressed is chosen (step S100). A number of DACs in a group is selected to be equal to the number of high frequency images to be suppressed plus one (step S102). Filter coefficients are chosen to produce a desired attenuation of an image (step S104). A number of groups is chosen so that a total number of DACs is equal to a number of chosen filter coefficients (step S106). The DACs are arranged in the configuration of FIG. 6 (step S108). An exemplary response obtained from a filter constructed in accordance with the process of FIG. 8 is shown in FIG. 9 for a 16 tap FIR response obtained with 16 DACs.

Figure 10:
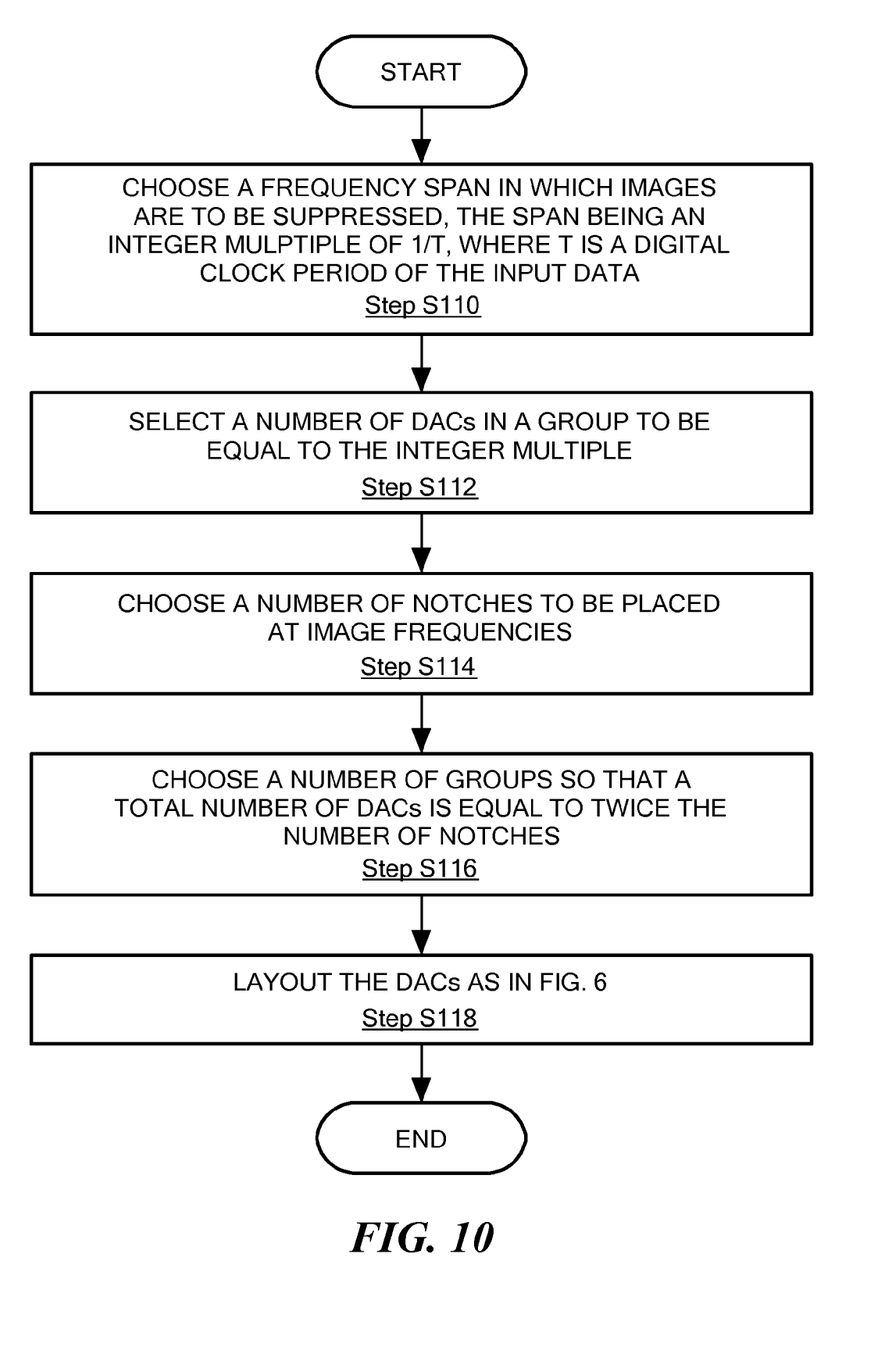
FIG. 10 is a flowchart of an alternative exemplary process for designing a digital filter according to principles of the present invention.
Figure 11:
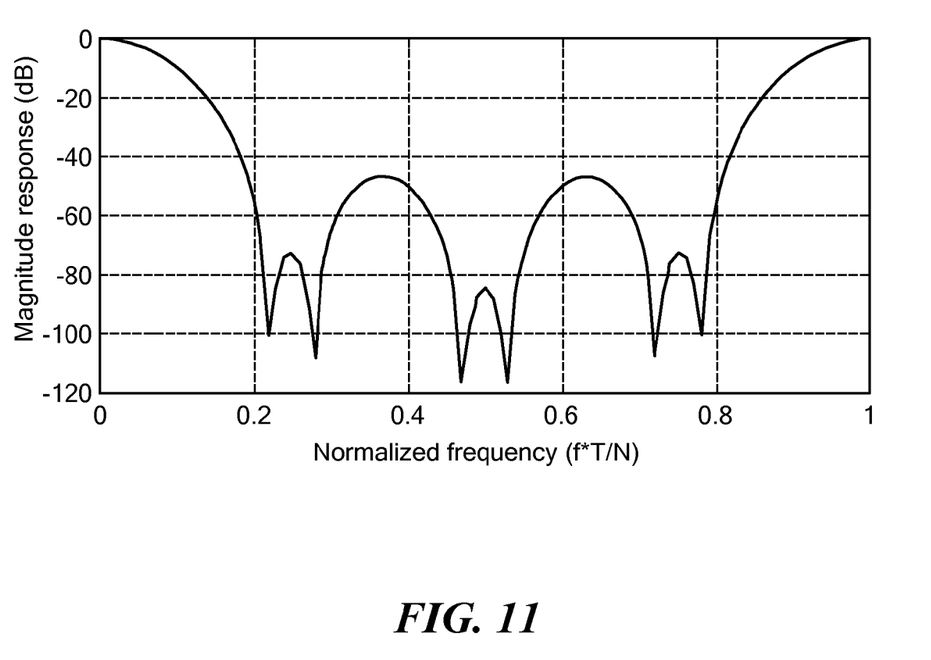
FIG. 11 is a response of a filter constructed according to the process of FIG. 10.

FIG. 10 is a flowchart of an alternative exemplary process for designing a digital filter such as the digital filter of FIG. 6. In this embodiment, the coefficients $f_m(k)$ are selected to provide notches in the frequency response at image locations. A frequency span in which images are to be suppressed is chosen, where the span is an integer multiple of 1/T, where T is the clock period of the input signal (step S110). A number of DACs equal to the integer multiple is chosen for each group (step S112). A number of notches to be placed at image frequencies is chosen (step S114). A number of groups is chosen so that the total number of DACs is equal to twice the number of notches (step S116). The DACs are arranged in the configuration of FIG. 6 (step S118). An exemplary response obtained from a filter constructed in accordance with the process of FIG. 10 is shown in FIG. 11 for a filter with 12 DACs to realize 6 notches (3 groups of DACs with 4 DACs in each group).

Present embodiments provide the ability to attenuate images in a frequency spectrum of a digital signal without increasing the digital clock rate or placing passive components at a DAC output. The multipliers and DACs of embodiments of the invention are all clocked at the same frequency as the input digital data. The embodiment of FIG. 8 can provide the same functionality as interpolation, but without increasing the digital clock frequency. Interpolation suppresses the first N−1 high frequency images that would otherwise be present in the frequency spectrum of the digital signal. The embodiment of FIG. 9 can provide image suppression over narrower frequency bands than the embodiment of FIG. 8, but uses fewer DACs.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A device for converting a digital input signal to an analog signal, the device comprising:
    2M+1 groups of N digital-to-analog converters, DACs, per group, each group receiving the digital input signal, M being an integer greater than or equal to zero and N being an integer greater than 1, each of the N DACs in a group being electrically in parallel and having a corresponding DAC input and DAC output, each DAC being clocked by a clock that differs in phase by 1/N of a clock period that clocks a preceding DAC of the N DACs in a group;
    2M+1 groups of N multipliers, one multiplier for each of the N DACs in a group, each multiplier multiplying the DAC input to a corresponding DAC by a corresponding filter coefficient; and
    a combiner, the combiner combining the DAC outputs to produce the analog signal.

2. The device of claim 1, further comprising 2M delay devices, the 2M delay devices delaying the digital input signal to a corresponding multiplier by one clock period for each of 2M ones of the 2M+1 groups.

3. The device of claim 1, further comprising a multiphase clock generator, the multiphase clock generator generating a plurality of clocks to clock the N DACs in a group, each of the plurality of clocks differing in phase by 1/N of a clock period.

4. The device of claim 1, wherein the device passes one portion of the frequency spectrum of the digital input signal while attenuating other portions of the frequency spectrum of the digital input signal.

5. The device of claim 1, wherein the device passes one portion of the frequency spectrum of the digital input signal while placing notches in other portions of the frequency spectrum of the digital input signal.

6. The device of claim 1, wherein device emulates a finite impulse response, FIR, filter having (2M+1)N taps.

7. The device of claim 1, wherein M equals 1 and N equals four.

8. The device of claim 1, wherein the device produces an analog signal having a frequency spectrum given by:

$$Y_{out}(\omega) = \frac{T}{N} D(\omega) \frac{\sin(\omega T/2N)}{\omega T/2N} \sum_{m=-M}^{M} \left( \sum_{k=1}^{N} f_m(k) e^{j\omega kT/N} \right) e^{j\omega mT}$$

where $\omega$ is a frequency variable with units of radians per second, T is a period of the clock, N is a number of different clock phases, $D(\omega)$ is a frequency spectrum of the digital input signal, and $f_m(k)$ are the filter coefficients.

9. A method of converting a digital input signal to an analog signal, the method comprising:
applying N clocks, one clock to each of N digital-to-analog converters, DACs, in a group, each clock differing in phase by 1/N of a clock period of the N clocks, N being an integer greater than 1, wherein the N DACs of a group are electrically in parallel;
multiplying a DAC input for each of the N DACs in at least one of 2M+1 groups of N DACs by a corresponding filter coefficient, M being an integer greater than or equal to zero; and
combining outputs of each of the (2M+1)N DACs to produce the analog signal.

10. The method of claim 9, further comprising delaying the digital input signal by one clock period for each of 2M groups of the 2M+1 groups to produce 2M delayed digital input signals.

11. The method of claim 9, further comprising multiplying the inputs to the N DACs in each of the 2M+1 groups by corresponding filter coefficients to emulate a finite impulse response, FIR, filter having (2M+1)N taps.

12. The method of claim 11, further comprising choosing the number N of DACs in a group to be substantially equal to a number of high frequency images to be suppressed.

13. The method of claim 12, further comprising choosing a number of groups 2M+1 so that a number of filter coefficients is sufficient to provide a desired attenuation of the high frequency images.

14. The method of claim 9, further comprising choosing the filter coefficients to emulate a filter having multiple notches at frequencies in images of a frequency spectrum of the digital input signal.

15. A device, comprising:
a clock generator producing:
a plurality of clocks, one of the plurality of clocks being a reference clock, each of the plurality of clocks other than the reference clock differing in phase from the reference clock by a different corresponding fraction of a clock period;
a filter coefficient generator, the filter coefficient generator generating a plurality of filter coefficients;
a plurality of groups of digital-to-analog converters, DACs, each group receiving an input that is delayed by at least one clock period from the input of a preceding group, each DAC having an input that is multiplied by one of the plurality of filter coefficients, each DAC being clocked by a corresponding one of the plurality of clocks, a clock period of a clock being T, N being a number of DACs in a group, and T/N being an effective sampling interval.

16. The device of claim 15, wherein the plurality of filter coefficients are selected to emulate a (2M+1)N tap digital filter where N is a number of DACs in a group, and 2M+1 are a number of groups.

17. The device of claim 15, wherein the plurality of filter coefficients are selected to pass one portion of the frequency spectrum of the input while attenuating other portions of the frequency spectrum of the input.

18. The device of claim 15, wherein a number of DACs in a group is chosen to be equal to an integer, the integer being equal to a number of clock periods that spans a range for which images are to be suppressed.

19. The device of claim 18, wherein a total number of groups is chosen so that a total number of DACs is substantially equal to twice a number of notches to be implemented by the plurality of filter coefficients.

* * * * *